(12) United States Patent
Yu et al.

(10) Patent No.: US 8,050,071 B2
(45) Date of Patent: Nov. 1, 2011

(54) MEMORY CORE AND SEMICONDUCTOR MEMORY DEVICE HAVING THE SAME

(75) Inventors: Je-Min Yu, Seoul (KR); In-Chul Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/980,975

(22) Filed: Dec. 29, 2010

(65) Prior Publication Data

US 2011/0090728 A1   Apr. 21, 2011

Related U.S. Application Data

(62) Division of application No. 12/220,422, filed on Jul. 24, 2008, now Pat. No. 7,869,241.

(30) Foreign Application Priority Data

Jul. 31, 2007   (KR) .............................. 2007-0076898

(51) Int. Cl.
*G11C 5/02* (2006.01)
(52) U.S. Cl. .................. 365/51; 365/63; 365/230.06
(58) Field of Classification Search .............. 365/51, 365/63, 230.06
See application file for complete search history.

(56) References Cited

U.S. PATENT DOCUMENTS

| | | | | |
|---|---|---|---|---|
| 5,768,174 A * | 6/1998 | Seo et al. | ......................... | 365/63 |
| 5,862,098 A * | 1/1999 | Jeong | ....................... | 365/230.06 |
| 5,940,343 A * | 8/1999 | Cha et al. | ................. | 365/230.06 |
| 5,978,247 A * | 11/1999 | Lee | ................................. | 365/63 |
| 5,986,917 A * | 11/1999 | Lee | ................................. | 365/96 |
| 6,026,038 A * | 2/2000 | Cho et al. | ....................... | 365/201 |
| 6,111,808 A | 8/2000 | Khang et al. | | |
| 6,222,789 B1 | 4/2001 | Cha | | |
| 6,266,286 B1 * | 7/2001 | Cho et al. | ....................... | 365/201 |
| 6,510,094 B2 * | 1/2003 | Chung et al. | ................... | 365/222 |
| 6,545,923 B2 * | 4/2003 | Sim et al. | ....................... | 365/204 |
| 6,747,908 B2 * | 6/2004 | Lee et al. | ................. | 365/230.03 |
| 6,813,216 B2 * | 11/2004 | Lee | .......................... | 365/230.06 |
| 7,187,615 B2 * | 3/2007 | Park et al. | ................ | 365/230.06 |

(Continued)

FOREIGN PATENT DOCUMENTS

KR   1997-0051278   7/1997
(Continued)

OTHER PUBLICATIONS

Application and Prosecution history of U.S. Appl. No. 12/220,422, filed Jul. 24, 2008, by Je-Min Yu, Entitled "Memory Core and Semiconductor Memory Device Having the Same", which is stored in the United States Patent and Trademark Office (USPTO) Image File Wrapper (IFW) System.

*Primary Examiner* — Viet Nguyen
(74) *Attorney, Agent, or Firm* — Onello & Mello, LLP (57) ABSTRACT

A memory core capable of decreasing the area of core conjunction region is disclosed. The memory core includes a first sub word-line driving circuit and a first sub word-line control signal generating circuit. The first sub word-line driving circuit is disposed in a first region, and generates a first word-line driving signal to provide the first word-line driving signal to an array unit. The first sub word-line control signal generating circuit is disposed in the first region, and generates the first sub word-line control signal based on a sub word-line driving signal. Therefore, the memory core has a small size and, consequently so can the semiconductor device.

7 Claims, 7 Drawing Sheets

U.S. PATENT DOCUMENTS

| | | | |
|---|---|---|---|
| 7,206,252 B2 * | 4/2007 | Kim ........................ | 365/230.06 |
| 7,248,535 B2 * | 7/2007 | Chun ....................... | 365/230.03 |
| 7,274,584 B2 * | 9/2007 | Jung et al. ................ | 365/63 |
| 7,333,378 B2 | 2/2008 | Sim ......................... | 365/203 |
| 7,359,273 B2 * | 4/2008 | Cho et al. ................ | 365/230.03 |
| 7,545,701 B2 * | 6/2009 | Min et al. ................. | 365/230.03 |
| 7,551,513 B2 * | 6/2009 | Yoon et al. .............. | 365/230.06 |
| 7,561,488 B2 * | 7/2009 | Lee et al. ................. | 365/230.06 |
| 7,567,481 B2 * | 7/2009 | Kim ........................ | 365/230.06 |
| 7,646,665 B2 * | 1/2010 | Kim et al. ................ | 365/230.06 |
| 7,800,961 B2 * | 9/2010 | Son et al. ................. | 365/189.09 |
| 7,869,241 B2 * | 1/2011 | Yu et al. .................. | 365/51 |
| 2005/0068840 A1 | 3/2005 | Park et al. | |
| 2006/0152992 A1 | 7/2006 | Jung et al. | |
| 2009/0034315 A1 | 2/2009 | Yu et al. | |

FOREIGN PATENT DOCUMENTS

| | | |
|---|---|---|
| KR | 2000-0018434 | 4/2000 |
| KR | 10-2005-0030468 | 3/2005 |
| KR | 10-2006-0082499 | 7/2006 |

* cited by examiner

MEMORY CORE AND SEMICONDUCTOR MEMORY DEVICE HAVING THE SAME

PRIORITY STATEMENT

This application is a divisional application of U.S. patent application Ser. No. 12/220,422, filed on Jul. 24, 2008, which claims the benefit of Korean Patent Application No. 2007-0076898, filed on Jul. 31, 2007 in the Korean Intellectual Property Office (KIPO), the contents of which applications are incorporated herein in their entirety by reference.

BACKGROUND

1. Field

The present invention relates to the field of semiconductor memory devices, and more particularly to a memory core that has small core conjunction area, and to a semiconductor memory device having the memory core.

2. Description of the Related Art

Semiconductor memory devices are used in various electronic products and applications.

Figure 1:
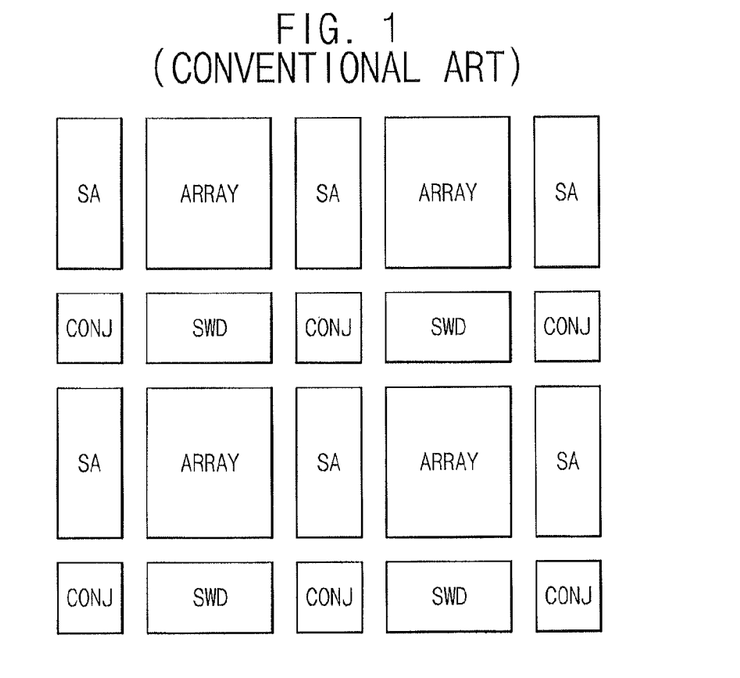
FIG. 1 is a diagram illustrating a layout of a memory core of a conventional semiconductor memory device.

FIG. 1 is a diagram illustrating a layout of a memory core in a conventional semiconductor memory device. Referring to FIG. 1, the memory core includes memory cell arrays, sense amplifiers SA, sub word-line driving circuits SWD, and core conjunction blocks CONJ. Generally, circuit blocks included in the memory core are arranged as shown in FIG. 1.

Figure 2:
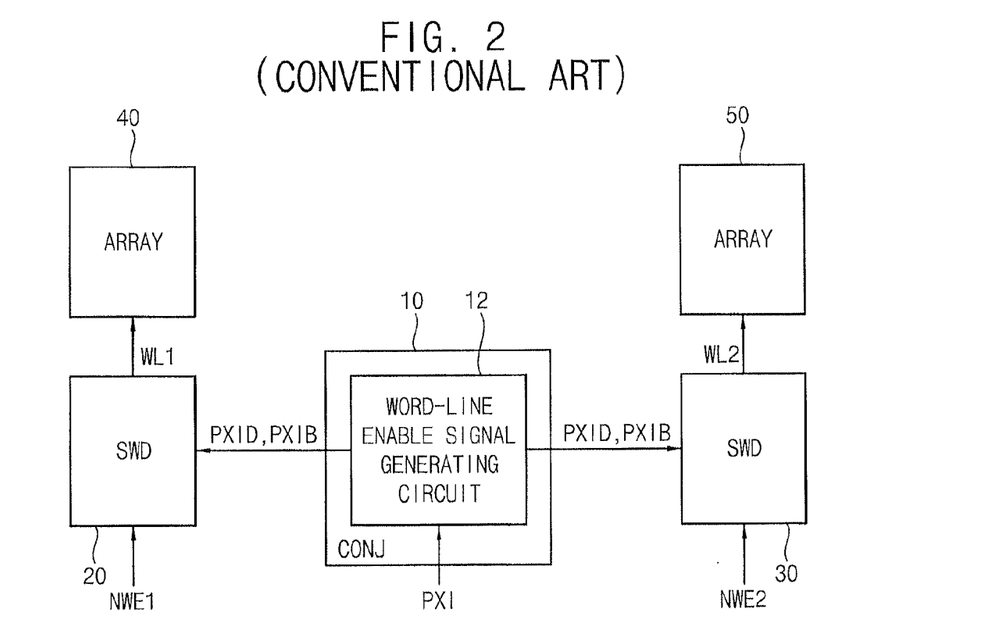
FIG. 2 is a block diagram illustrating the memory core shown in FIG. 1.

FIG. 2 is a block diagram illustrating a more detailed view of the memory core shown in FIG. 1. Referring to FIG. 2, a word-line enable signal generating circuit 12 disposed in the core conjunction block 10 generates a first sub word-line control signal PXIB and a second sub word-line control signal PXID. A first sub word-line driving circuit 20 generates a first word-line driving signal WL1 based on a first main word-line driving signal NWE1, the first sub word-line control signal PXIB and the second sub word-line control signal PXID. A second sub word-line driving circuit 30 generates a second word-line driving signal WL2 based on a second main word-line driving signal NWE2, the first sub word-line control signal PXIB and the second sub word-line control signal PXID. A first memory cell array 40 operates in response to the first word-line driving signal WL1, and a second memory cell array 50 operates in response to the second word-line driving signal WL2.

The transmission speed of input data and output data of a semiconductor memory device, such as a dynamic random access memory (DRAM), is ever increasing. As the speed of the input data and output data increases, the speed of a memory core has to be increased. Generally, the speed of a memory core may be increased by increasing the number of input/output lines (IO lines). When the number of IO lines is increased, the size of a control circuit is increased. The control circuit is usually arranged in the core conjunction region. Therefore, the area of the core conjunction region is increased as the speed of a memory core increases.

SUMMARY

In accordance with some aspects of the present invention, provided is a memory core that has small core conjunction area.

Also in accordance with some aspects of the present invention, provided a semiconductor memory device having the memory core that has small core conjunction area.

In accordance with one aspect of the present invention, a memory core includes a first sub word-line driving circuit and a first sub word-line control signal generating circuit. The first sub word-line driving circuit is disposed in a first region, and configured to generate a first word-line driving signal based on a first sub word-line control signal, a second sub word-line control signal, and a first main word-line driving signal, and to provide the first word-line driving signal to a first array unit. The first sub word-line control signal generating circuit is disposed in the first region, and is configured to generate the first sub word-line control signal based on a sub word-line driving signal.

The first region can be outside of a core conjunction region.

The first sub word-line driving circuit can be configured to provide one of the second sub word-line control signal and a low power supply voltage to an output node in response to the first main word-line driving signal.

The first sub word-line driving circuit can be configured to deactivate the output node in response to the first sub word-line control signal.

The first sub word-line driving circuit can be configured to deactivate word-lines coupled to the output node when the first sub word-line control signal is enabled.

The first sub word-line control signal generating circuit can be configured to invert the sub word-line driving signal to generate the first sub word-line control signal.

The first sub word-line control signal generating circuit can include dummy transistors disposed in an edge portion of the first region that includes the first sub word-line driving circuit.

The memory core can further include a second sub word-line control signal generating circuit that is disposed in a second region, and configured to generate the second sub word-line control signal based on the sub word-line driving signal.

The second region can be a core conjunction region that is separate from the first region.

The second sub word-line control signal generating circuit can be configured to delay the sub word-line driving signal to generate the second sub word-line control signal.

The memory core can further include a second sub word-line driving circuit and a third sub word-line control signal generating circuit. The second sub word-line driving circuit can be disposed in a third region, and can be configured to generate the second word-line driving signal based on the first sub word-line control signal, the second sub word-line control signal, and a second main word-line driving signal, and to provide the second word-line driving signal to a second array unit. The third sub word-line control signal generating circuit can be disposed in the third region, and can be configured to generate the first sub word-line control signal based on the sub word-line driving signal.

The second sub word-line driving circuit can be configured to provide one of the second sub word-line control signal and a low power supply voltage to an output node in response to the second main word-line driving signal.

The second sub word-line driving circuit can be configured to deactivate the output node in response to the first sub word-line control signal.

The memory core can further comprise a second sub word-line driving circuit disposed in a third region and configured to generate the second word-line driving signal based on the first sub word-line control signal, the second sub word-line control signal, and a second main word-line driving signal and to provide the second word-line driving signal to a second array unit.

The second sub word-line driving circuit can be configured to provide one of the second sub word-line control signal and a low power supply voltage to an output node in response to the second main word-line driving signal.

The second sub word-line driving circuit can be configured to deactivate the output node in response to the first sub word-line control signal.

In accordance with another aspect of the present invention, provided is a semiconductor memory device that includes a sub word-line driving circuit, a first sub word-line control signal generating circuit, a second sub word-line control signal generating circuit and an array unit. The sub word-line driving circuit is disposed in a first region, and configured to generate a word-line driving signal based on a first sub word-line control signal, a second sub word-line control signal, and a first main word-line driving signal and to provide the first word-line driving signal to a first array unit. The first sub word-line control signal generating circuit is disposed in the first region, and configured to generate the first sub word-line control signal based on a sub word-line driving signal. The second sub word-line control signal generating circuit is disposed in a second region, and configured to generate the second sub word-line control signal based on the sub word-line driving signal. The first array unit is configured to operate in response to the word-line driving signal.

In accordance with another aspect of the present invention, provided is a memory core that includes a sub word-line driving circuit, an inverter, and a word-line enable signal generating circuit. The sub word-line driving circuit is disposed in a first region, which is outside of a core conjunction region. The inverter circuit is disposed in the first region and coupled to the sub word-line driving circuit. The word-line enable signal generating circuit is disposed in the core conjunction region and coupled to the sub word-line driving circuit.

Here, the word-line enable signal may have a meaning that includes a sub word-line control signal.

The inverter circuit can be configured to invert a sub word-line driving signal (PXI) to generate a first sub word-line control signal (PXIB).

The inverter circuit can be configured to invert an equalizer control signal to generate an inverted equalization control signal.

The inverter circuit can be configured to invert a sense amplifier enable signal to generate an inverted sense amplifier enable signal.

In accordance with yet another aspect of the present invention, a semiconductor memory device includes a sub word-line driving circuit, an inverter circuit, a word-line enable signal generating circuit, and an array unit. The sub word-line driving circuit is disposed in a first region, which is outside of a core conjunction region. The inverter circuit is disposed in the first region and coupled to the sub word-line driving circuit. The word-line enable signal generating circuit is disposed in the core conjunction region and coupled to the sub word-line driving circuit. The array unit is disposed in a second region, that is separate from the first region and the core conjunction region, and configured to receive a first word-line driving signal from the sub word-line driving circuit.

Therefore, a memory core according to aspects the present invention is capable of effectively decreasing the size of a core conjunction region by disposing a part or whole of the sub word-line control signal generating circuit outside of the core conjunction region. Further, such a memory core is capable of effectively decreasing the size of a core conjunction region by disposing a circuit for inverting an equalization control signal or a circuit for inverting a sense amplifier enable signal inside of the sub word-line driving circuit region. Further, such a memory core can be configured to implement a part or whole of the sub word-line control signal generating circuit using dummy transistors existing in the area in which the sub word-line driving circuit is disposed.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DESCRIPTION OF THE EMBODIMENTS

Embodiments in accordance with aspects of the present invention will now be described more fully with reference to the accompanying drawings. This invention may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 3:
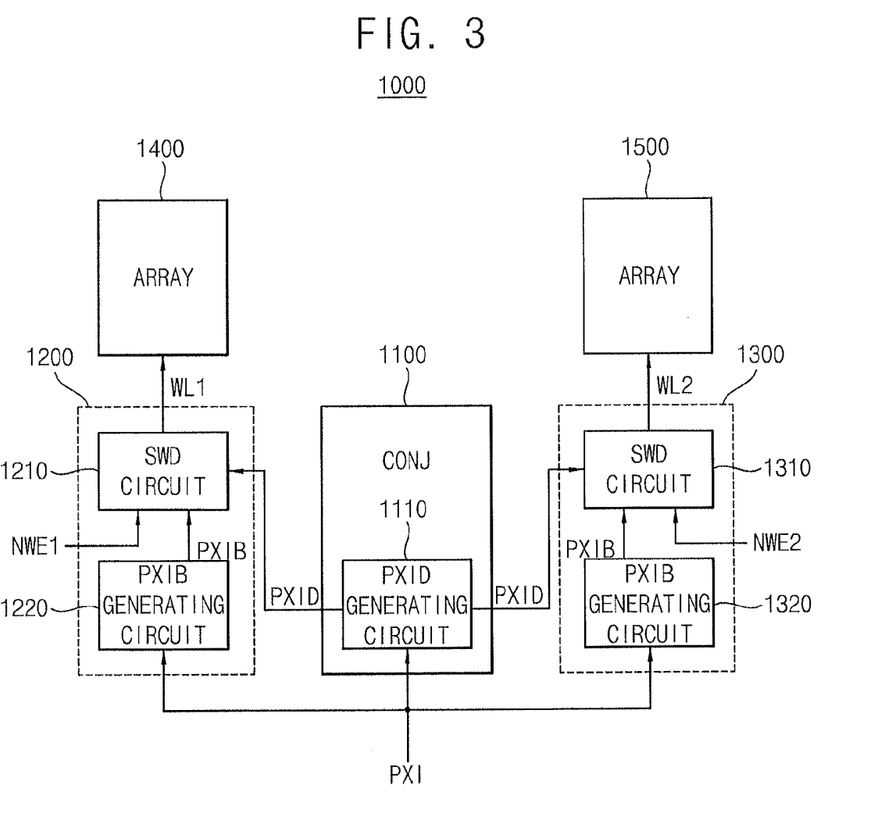
FIG. 3 is a block diagram illustrating a first example embodiment of a memory core of a semiconductor memory device according to an aspect of the present invention.

FIG. 3 is a block diagram illustrating a first example embodiment of a memory core 1000 of a semiconductor memory device according to an aspect of the present invention.

Referring to FIG. 3, the memory core 1000 includes a core conjunction block 1100, a first sub word-line driving circuit 1210, a first sub word-line control signal generating circuit 1220, a second sub word-line driving circuit 1310, a second sub word-line control signal generating circuit 1320, a first memory cell array 1400, and a second memory cell array 1500. Here, a core conjunction block corresponds to a core conjunction region, and a memory cell array corresponds to a memory cell region.

A memory core can include a plurality of memory cell arrays, a plurality of core conjunction regions, and a plurality of sub word-line driving circuit regions, and a plurality of sense amplifier regions. In the example embodiment configuration shown in FIG. 3, the memory core has two memory cell arrays, one core conjunction region CONJ, and two sub word-line driving circuit regions 1200 and 1300. For convenience of description, only two memory cell arrays are illustrated in FIG. 3, but any number of memory cell arrays may be included in the memory core. Further, in FIG. 3, a sense amplifier region SA is omitted for the purposes of this description.

The first sub word-line driving circuit 1210 and the first sub word-line control signal generating circuit 1220 are disposed in a first region 1200, and the second sub word-line driving circuit 1310 and the second sub word-line control signal generating circuit 1320 are disposed in a second region 1300. The core conjunction block 1100 includes a third sub word-line control signal generating circuit 1110.

Referring to FIG. 3, the first sub word-line control signal generating circuit 1220 and the second sub word-line control signal generating circuit 1320 generate a first sub word-line control signal PXIB based on a sub word-line driving signal PXI. And the third sub word-line control signal generating circuit 1110, which is disposed in the core conjunction block 1100, generates a second sub word-line control signal PXID based on the sub word-line driving signal PXI.

The first sub word-line driving circuit 1210 generates a first word-line driving signal WL1 based on the first sub word-line control signal PXIB, the second sub word-line control signal PXID, and a first main word-line driving signal NWE1. The second sub word-line driving circuit 1310 generates a second word-line driving signal WL2 based on the first sub word-line control signal PXIB, the second sub word-line control signal PXID, and a second main word-line driving signal NWE2.

The first memory cell array 1400 operates in response to the first word-line driving signal WL1, and the second memory cell array 1500 operates in response to the second word-line driving signal WL2. The first memory cell array 1400 corresponds to a first memory cell array region, and the second memory cell array 1500 corresponds to a second memory cell array region.

Figure 4:
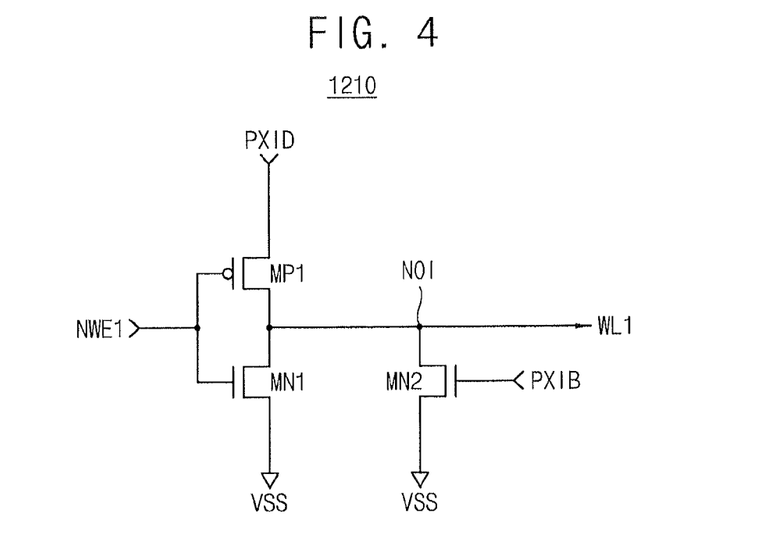
FIG. 4 is a circuit diagram illustrating an embodiment of a sub word-line driving circuit included in the memory core of FIG. 3.

FIG. 4 is a circuit diagram illustrating an embodiment of a first sub word-line driving circuit 1210 that can be included in the memory core 1000 of FIG. 3.

Referring to FIG. 4, the first sub word-line driving circuit 1210 includes a first PMOS transistor MP1, a first NMOS transistor MN1, and a second NMOS transistor MN2.

An inverter, which is comprised of the first PMOS transistor MP1 and the first NMOS transistor MN1, provides one of the second sub word-line control signal PXID and a low power supply voltage VSS to an output node NO1 in response to the first main word-line driving signal NWE1. When the first main word-line driving signal NWE1 has logic "low" state, the second sub word-line control signal PXID is provided to the output node NO1. When the first main word-line driving signal NWE1 has logic "high" state, the low power supply voltage VSS is provided to the output node NO1. The second NMOS transistor MN2 pulls down a voltage at the output node NO1 in response to the first sub word-line control signal PXIB. For example, when the first sub word-line control signal PXIB has logic "high" state, the second NMOS transistor MN2 deactivates word-lines coupled to the output node NO1.

The second sub word-line driving circuit 1310 shown in FIG. 3 can have the same structure as the first sub word-line driving circuit 1210 shown in FIG. 4. Therefore, the second sub word-line driving circuit 1310 is not discussed in detail herein.

Figure 5:
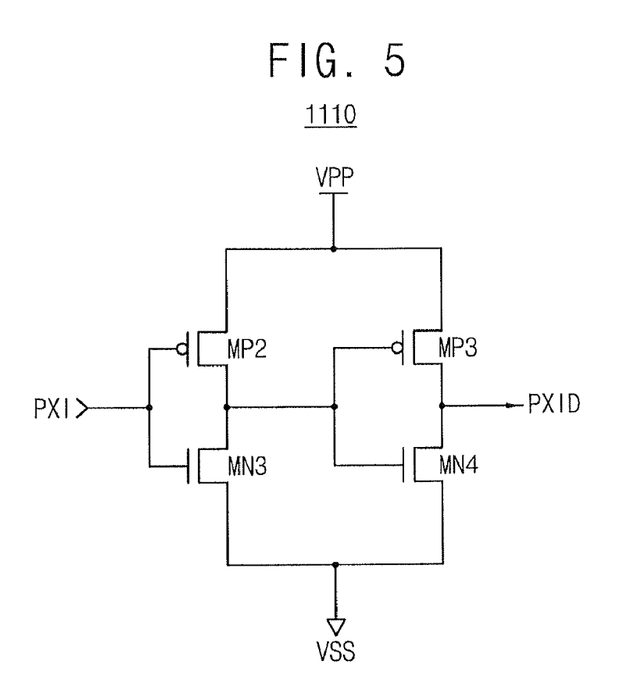
FIG. 5 is a circuit diagram illustrating an embodiment of a third sub word-line control signal generating circuit included in the memory core of FIG. 3.

FIG. 5 is a circuit diagram illustrating an embodiment of a third sub word-line control signal generating circuit 1110 that can be included in the memory core 1000 of FIG. 3.

Referring to FIG. 5, the third sub word-line control signal generating circuit 1110 includes a second PMOS transistor MP2, a third NMOS transistor MN3, a third PMOS transistor MP3, and a fourth NMOS transistor MN4.

An inverter, which is comprised of the second PMOS transistor MP2 and the third NMOS transistor MN3, inverts the sub word-line driving signal PXI. A boosted voltage VPP is applied to a source of the second PMOS transistor MP2 and the third PMOS transistor MP3. Another inverter, which is comprised of the third PMOS transistor MP3 and the fourth NMOS transistor MN4, inverts an output signal of the former inverter (comprised of the second PMOS transistor MP2 and the third NMOS transistor MN3) to generate the second sub word-line control signal PXID. Therefore, the second sub word-line control signal PXID is the sub word-line driving signal PXI delayed, i.e., delayed by the third sub word-line control signal generating circuit 1110.

Figure 6:
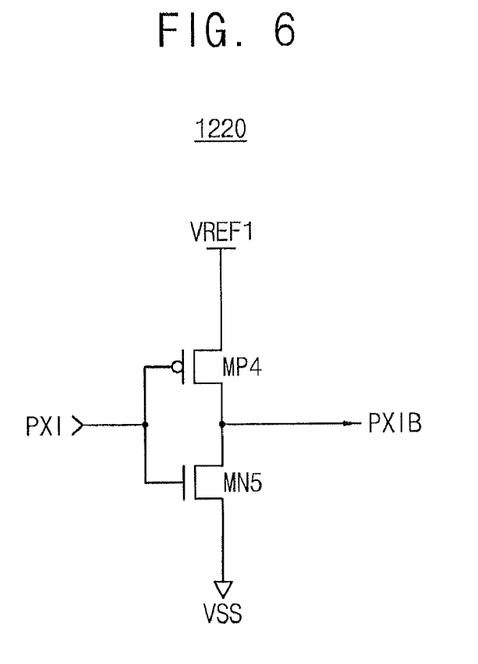
FIG. 6 is a circuit diagram illustrating an embodiment of a first sub word-line control signal generating circuit included in the memory core of FIG. 3.

FIG. 6 is a circuit diagram illustrating an embodiment of a first sub word-line control signal generating circuit 1220 that can be included in the memory core 1000 of FIG. 3.

Referring to FIG. 6, the first sub word-line control signal generating circuit 1220 includes a fourth PMOS transistor MP4 and a fifth NMOS transistor MN5. An inverter, which is comprised of the fourth PMOS transistor MP4 and the fifth NMOS transistor MN5, inverts the sub word-line driving signal PXI to generate the first word-line control signal PXIB. Therefore, the first word-line control signal PXIB is the sub word-line driving signal PXI inverted, i.e., inverted by the first sub word-line control signal generating circuit 1220. The first sub word-line control signal generating circuit 1220 is coupled between a first reference voltage VREF1 and the low supply voltage VSS. An internal supply voltage VINTA or the boosted voltage VPP can be used as the first reference voltage VREF1.

The second sub word-line control signal generating circuit 1320 shown in FIG. 3 can have the same structure as the first sub word-line control signal generating circuit 1220 shown in FIG. 6. Therefore, the second sub word-line control signal generating circuit 1320 is not discussed in detail herein.

Figure 7:
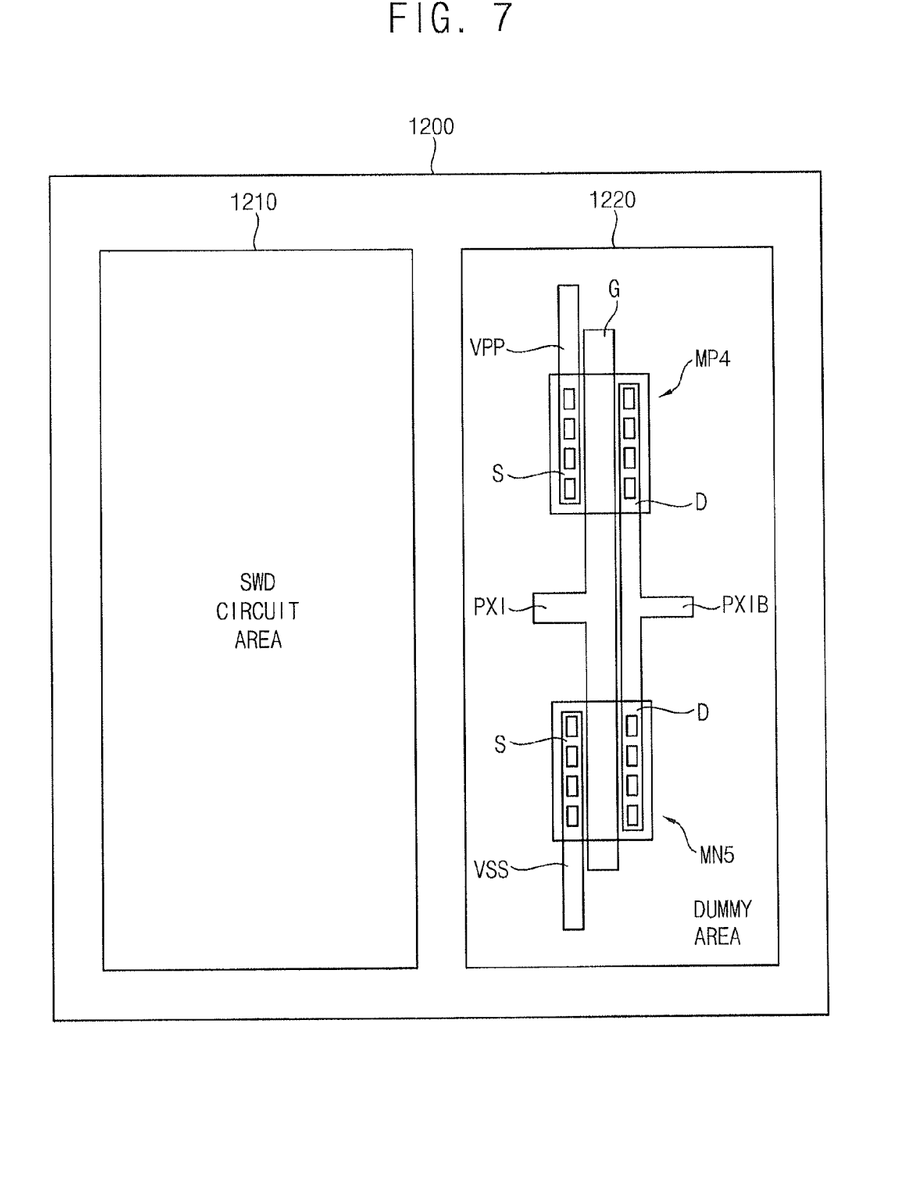
FIG. 7 is a diagram illustrating an embodiment of a layout of a first region that includes the first sub word-line control signal generating circuit of FIG. 6.

FIG. 7 is a diagram illustrating an embodiment of a layout of a first region 1200 that includes the first sub word-line control signal generating circuit 1220 of FIG. 6. FIG. 7 illustrates a layout of the inverter, as shown in FIG. 6, in the first sub word-line control signal generating circuit 1220.

Referring to FIG. 7, the first sub word-line control signal generating circuit 1220 is disposed adjacent to the first sub word-line driving circuit 1210 in the first region 1200. In the periphery of the first sub word-line driving circuit 1210, unused PMOS transistors and NMOS transistors, i.e., dummy transistors, may exist. Therefore, the first sub word-line control signal generating circuit 1220 can be implemented using the dummy transistors that exist in the periphery of the first sub word-line driving circuit 1210, as an example.

The boosted voltage VPP is applied to a source terminal S of the PMOS transistor MP4, and the low supply voltage VSS is applied to a source terminal S of the NMOS transistor MN5. The sub word-line driving signal PXI is applied to a common gate terminal G of the PMOS transistor MP4 and the NMOS transistor MN5, and the first word-line control signal PXIB is output from a common drain terminal D of the PMOS transistor MP4 and the NMOS transistor MN5.

The PMOS transistor MP4 and the NMOS transistor MN5 can be dummy transistors that exist in a dummy area, as is shown in this embodiment. But the present invention is not limited to such placement.

Hereinafter, an example embodiment of an operation of a semiconductor memory device having the memory core 1000 according to aspects of the present invention will be described referring to FIG. 3 to FIG. 7.

Referring to FIG. 3, the first sub word-line control signal generating circuit 1220 and the second sub word-line control signal generating circuit 1320 invert the sub word-line driving signal PXI to generate the first sub word-line control signal PXIB. The third sub word-line control signal generating circuit 1110 delays the sub word-line driving signal PXI to generate the second sub word-line control signal PXID. The sub word-line driving signal PXI may be generated in a row decoder (not shown) based on commands and addresses, as would be understood by those skilled in the art.

The first sub word-line driving circuit 1210 outputs the second sub word-line control signal PXID or the low supply voltage VSS as the first word-line driving signal WL1 in response to the first main word-line driving signal NWE1. The second sub word-line driving circuit 1310 outputs the second sub word-line control signal PXID or the low supply voltage VSS as the second word-line driving signal WL2 in response to the second main word-line driving signal NWE2. The first main word-line driving signal NWE1 and the second main word-line driving signal NWE2 can be generated in the row decoder (not shown) based on the commands and the addresses, as would be understood by those skilled in the art.

The memory cell array 1400 is activated in response to the first word-line driving signal WL1, and the memory cell array 1500 is activated in response to the second word-line driving signal WL2.

The first sub word-line control signal generating circuit 1220 is disposed adjacent to the first sub word-line driving circuit 1210 in the first area 1200. The second sub word-line control signal generating circuit 1320 is disposed adjacent to the second sub word-line driving circuit 1310 in the second area 1300. The third sub word-line control signal generating circuit 1110 is included in the core conjunction region 1100. The first sub word-line control signal generating circuit 1220 can be implemented using dummy transistors that exist in the periphery of the first sub word-line driving circuit 1210 in the first area 1200. The second sub word-line control signal generating circuit 1320 can be implemented using dummy transistors that exist in the periphery of the second sub word-line driving circuit 1310 in the second area 1300, for example.

In the memory core of FIG. 3, the sub word-line driving circuits 1210 and 1310 have separate sub word-line control signal generating circuits 1220 and 1320, respectively. Therefore, when the sub word-line driving circuits have separate sub word-line control signal generating circuits, the sub word-line control signal generating circuits are capable of safely driving the sub word-line driving circuits even when the size of MOS transistors in the sub word-line control signal generating circuits is small.

As the operating speed of a semiconductor memory device is increased, the size of logic circuits included in the core conjunction area is also increased in typical memory core approaches. However, in accordance with aspects of the present invention, the memory core 1000 of FIG. 3 may decrease the size of the core conjunction area by disposing the sub word-line control signal generating circuits 1220 and 1320 outside of the core conjunction area. In the example embodiment illustrated in FIG. 3, the sub word-line control signal generating circuits 1220 and 1320 can be disposed adjacent to the sub word-line driving circuits 1210 and 1310, respectively.

Figure 8:
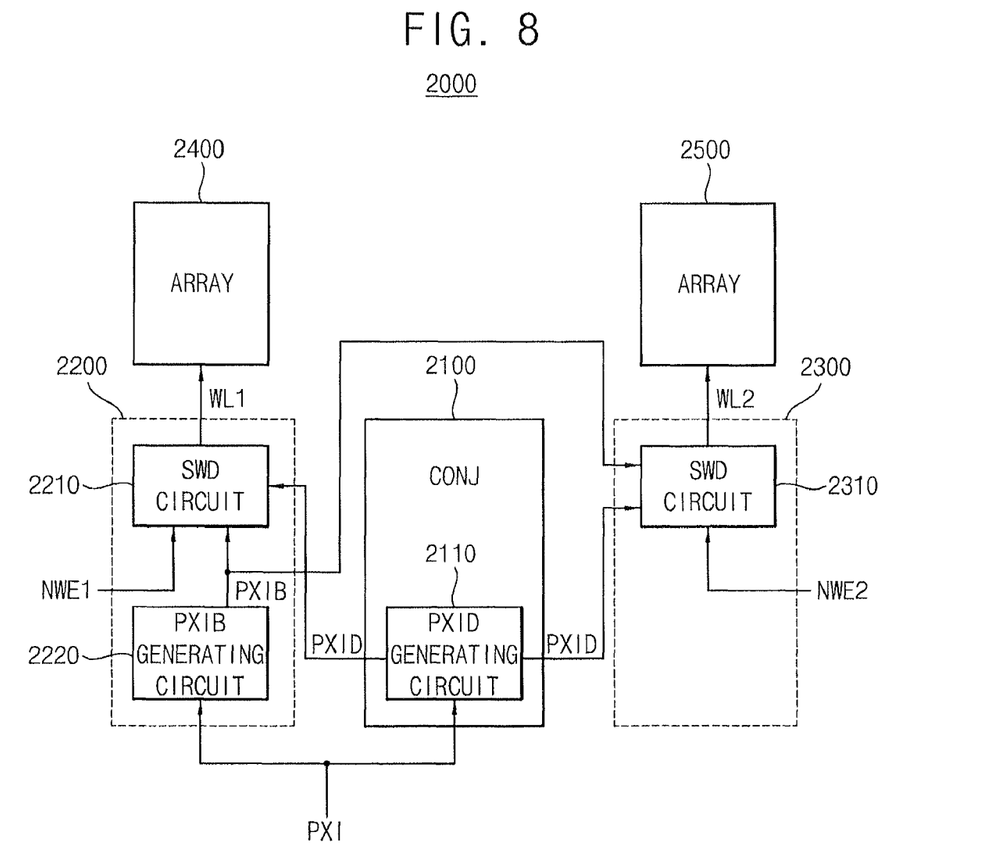
FIG. 8 is a block diagram illustrating a second example embodiment of a memory core of a semiconductor memory device according to an aspect of the present invention.

FIG. 8 is a block diagram illustrating a second example embodiment of a memory core 2000 of a semiconductor memory device according to another aspect of the present invention.

Referring to FIG. 8, the memory core 2000 includes a core conjunction block 2100, a first sub word-line driving circuit 2210, a first sub word-line control signal generating circuit 2220, a second sub word-line driving circuit 2310, a first memory cell array 2400 and a second memory cell array 2500. Here, a core conjunction block corresponds to a core conjunction region, and a memory cell array corresponds to a memory cell region.

The first sub word-line driving circuit 2210 and the first sub word-line control signal generating circuit 2220 are disposed in a first region 2200, and the second sub word-line driving circuit 2310 is disposed in a second region 2300. The core conjunction block 2100 includes a third sub word-line control signal generating circuit 2110. The first region 2200 and the second region 2300 are sub word-line driving circuit regions (SWD regions).

In an example embodiment configuration shown in FIG. 8, the memory core 2000 has two memory cell arrays, one core conjunction region, and two sub word-line driving circuit regions 2200 and 2300. As mentioned above, the number of the memory cell arrays can be varied. That is, a memory core can include three or more memory cell arrays, a plurality of core conjunction regions, and a plurality of sub word-line driving circuit regions, and a plurality of sense amplifier regions. The sense amplifier region SA is omitted in FIG. 8.

Referring to FIG. 8, the first sub word-line control signal generating circuit 2220 generates a first sub word-line control signal PXIB based on the sub word-line driving signal PXI. The third sub word-line control signal generating circuit 2110, which is disposed in the core conjunction block 2100, generates a second sub word-line control signal PXID based on the sub word-line driving signal PXI.

The first sub word-line driving circuit 2210 generates a first word-line driving signal WL1 based on the first sub word-line control signal PXIB, the second sub word-line control signal PXID, and a first main word-line driving signal NWE1. The second sub word-line driving circuit 2310 generates a second word-line driving signal WL2 based on the first sub word-line control signal PXIB, the second sub word-line control signal PXID, and a second main word-line driving signal NWE2.

The first memory cell array 2400 operates in response to the first word-line driving signal WL1, and the second memory cell array 2500 operates in response to the second word-line driving signal WL2.

In the memory core 2000 of FIG. 8, the first sub word-line driving circuit 2210 that drives the first memory cell array 2400 and the second sub word-line driving circuit 2310 that drives the second memory cell array 2500 to operate in response the to first sub word-line control signal PXIB that is generated by the first sub word-line control signal generating circuit 2220. The second region 2300, in which the second sub word-line driving circuit 2310 is disposed, does not include a sub word-line control signal generating circuit.

The operation of the memory core of FIG. 8 is similar to the operation of the memory core of FIG. 3, and thus repeated descriptions are omitted.

Figure 9:
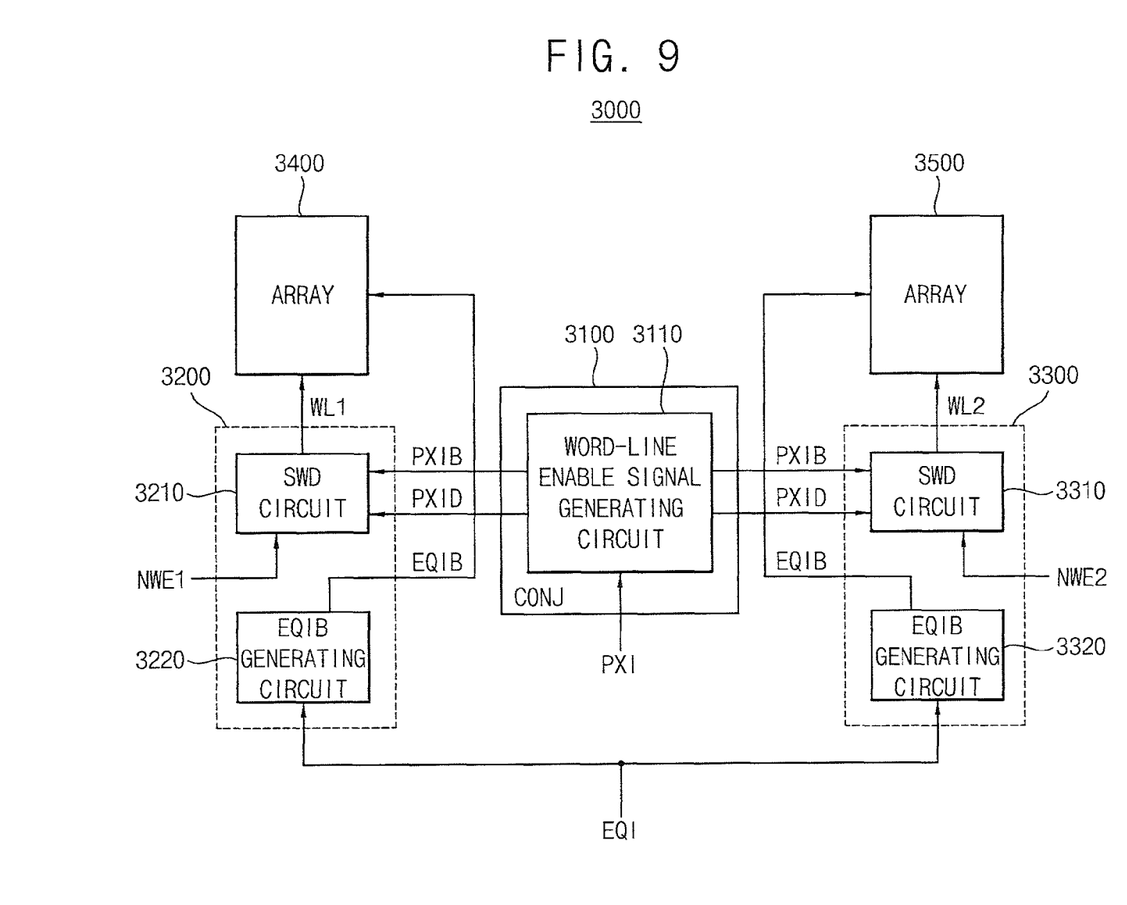
FIG. 9 is a block diagram illustrating a third example embodiment of a memory core of a semiconductor memory device according to an aspect of the present invention.

FIG. 9 is a block diagram illustrating a third example embodiment of a memory core 3000 of a semiconductor memory device according to an aspect of the present invention.

Referring to FIG. 9, the memory core 3000 includes a core conjunction block 3100, a first sub word-line driving circuit 3210, a first equalization control signal generating circuit 3220, a second sub word-line driving circuit 3310, a second equalization control signal generating circuit 3320, a first memory cell array 3400, and a second memory cell array 3500. Here, the core conjunction block 3100 corresponds to a core conjunction region, and a memory cell array corresponds to a memory cell region.

The first sub word-line driving circuit 3210 and the first equalization control signal generating circuit 3220 are disposed in the first region 3200, and the second sub word-line driving circuit 3310 and the second equalization control signal generating circuit 3320 are disposed in the second region 3300. The core conjunction block 3100 includes a word-line enable signal generating circuit 3110. The first region 3200 and the second region 3300 are sub word-line driving circuit regions (SWD regions).

In an example configuration shown in FIG. 9, the memory core 3000 has two memory cell arrays, one core conjunction region, and two sub word-line driving circuit regions 3200 and 3300. As mentioned above, the number of the memory cell arrays can be varied. That is, a memory core can include three or more memory cell arrays, a plurality of core conjunction regions, a plurality of sub word-line driving circuit regions and a plurality of sense amplifier regions. The sense amplifier region SA is omitted in FIG. 9.

Referring to FIG. 9, the first equalization control signal generating circuit 3220 and the second equalization control signal generating circuit 3320 generate an inverted equalization control signal EQIB based on an equalization control signal EQI. The word-line enable signal generating circuit 3110, which is disposed in the core conjunction block 3100, generates a first sub word-line control signal PXIB and a second sub word-line control signal PXID based on a sub word-line driving signal PXI. The first sub word-line control signal PXIB can be an inverted signal of the sub word-line driving signal PXI, and the second sub word-line control signal PXID can be a delayed signal of the sub word-line driving signal PXI. The word-line enable signal can be a sub word-line control signal.

The first sub word-line driving circuit 3210 generates a first word-line driving signal WL1 based on the first sub word-line control signal PXIB, the second sub word-line control signal PXID, and a first main word-line driving signal NWE1. The second sub word-line driving circuit 3310 generates a second word-line driving signal WL2 based on the first sub word-line control signal PXIB, the second sub word-line control signal PXID, and a second main word-line driving signal NWE2.

The first memory cell array 3400 operates in response to the first word-line driving signal WL1 and the inverted equalization control signal EQIB, and the second memory cell array 3500 operates in response to the second word-line driving signal WL2 and the inverted equalization control signal EQIB. The inverted equalization control signal EQIB controls an equalization circuit that equalizes bit-line pairs.

In the memory core 3000 of FIG. 9, the first equalization control signal generating circuit 3220, which inverts the equalization control signal EQI, is disposed adjacent to the first sub word-line driving circuit 3210 in the first region 3200. In the first region 3200, unused dummy transistors can exist. The first equalization control signal generating circuit 3220 can be implemented using the dummy transistors that exist in the first region 3200. In the same way, the second equalization control signal generating circuit 3320, which inverts the equalization control signal EQI, can be disposed adjacent to the second sub word-line driving circuit 3310 in the second region 3300. In the second region 3300, unused dummy transistors can exist. And the second equalization control signal generating circuit 3320 can be implemented using the dummy transistors that exist in the second region 3300.

The memory core 3000 of FIG. 9 can decrease the size of the core conjunction area by disposing the equalization control signal generating circuits 3220 and 3320 in the sub word-line driving circuit area. Therefore, other logic circuits can be disposed in the core conjunction area.

The operation of the memory core of FIG. 9 is similar to the operation of the memory core of FIG. 3, and thus further description is omitted.

Figure 10:
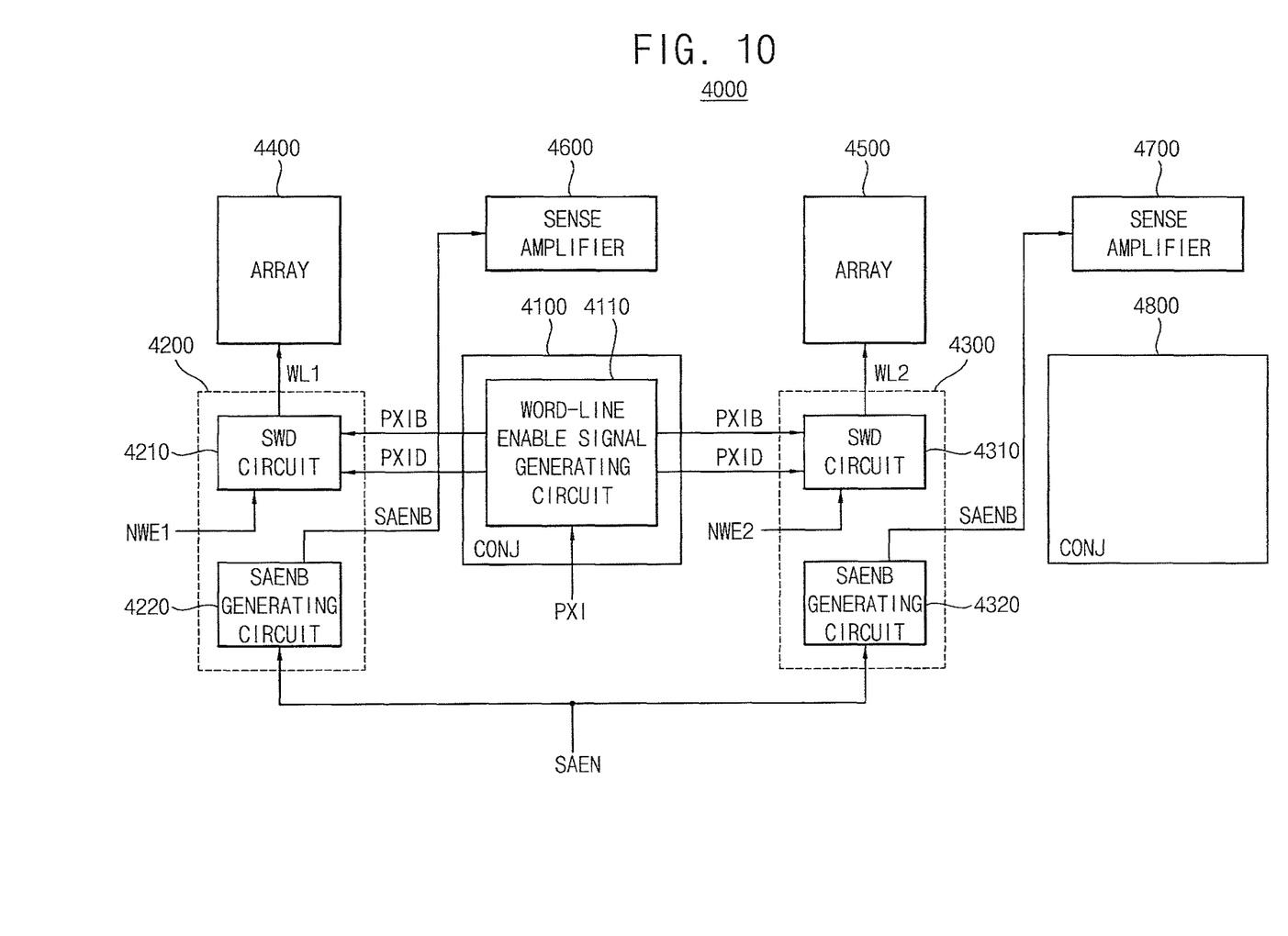
FIG. 10 is a block diagram illustrating a fourth example embodiment a memory core of a semiconductor memory device according to an aspect of the present invention.

FIG. 10 is a block diagram illustrating a fourth example embodiment of a memory core of a semiconductor memory device according to an aspect of the present invention.

Referring to FIG. 10, the memory core 4000 includes a core conjunction block 4100, a first sub word-line driving circuit 4210, a first sense amplifier enable signal generating circuit 4220, a second sub word-line driving circuit 4310, a second sense amplifier enable signal generating circuit 4320, a first memory cell array 4400, a second memory cell array 4500, and sense amplifiers 4600 and 4700. Here, the core conjunction block 4100 corresponds to a core conjunction region, and a memory cell array corresponds to a memory cell region.

The first sub word-line driving circuit 4210 and the first sense amplifier enable signal generating circuit 4220 are disposed in the first region 4200, and the second sub word-line driving circuit 4310 and the second first sense amplifier enable signal generating circuit 4320 are disposed in the second region 4300. The core conjunction block 4100 includes a word-line enable signal generating circuit 4110. The first region 4200 and the second region 4300 are sub word-line driving circuit regions (SWD regions).

In an example configuration shown in FIG. 10, the memory core has two memory cell arrays 4400 and 4500, one core conjunction region, and two sub word-line driving circuit regions 4200 and 4300. As mentioned above, the number of the memory cell arrays can be varied. That is, the memory core 4000 can include three or more memory cell arrays, a plurality of core conjunction regions, a plurality of sub wordline driving circuit regions, and a plurality of sense amplifier regions.

Referring to FIG. 10, the first sense amplifier enable signal generating circuit 4220 and the second sense amplifier enable signal generating circuit 4320 generate an inverted sense amplifier enable signal SAENB based on a sense amplifier enable signal SAEN. The word-line enable signal generating circuit 4110, which is disposed in the core conjunction block 4100, generates a first sub word-line control signal PXIB and a second sub word-line control signal PXID based on a sub word-line driving signal PXI. As aforementioned, the first sub word-line control signal PXIB can be an inverted signal of the sub word-line driving signal PXI, and the second sub word-line control signal PXID can be a delayed signal of the sub word-line driving signal PXI.

The first sub word-line driving circuit 4210 generates a first word-line driving signal WL1 based on the first sub word-line control signal PXIB, the second sub word-line control signal PXID, and a first main word-line driving signal NWE1. The second sub word-line driving circuit 4310 generates a second word-line driving signal WL2 based on the first sub word-line control signal PXIB, the second sub word-line control signal PXID, and a second main word-line driving signal NWE2.

The first memory cell array 4400 operates in response to the first word-line driving signal WL1, and the second memory cell array 4500 operates in response to the second word-line driving signal WL2. The first sense amplifier 4600 operates in response to the inverted sense amplifier enable signal SAENB, which is an output signal of the first sense amplifier enable signal generating circuit 4220, and the second sense amplifier 4700 operates in response to the inverted sense amplifier enable signal SAENB, which is an output signal of the second sense amplifier enable signal generating circuit 4320.

In the memory core 4000 of FIG. 10, the first sense amplifier enable signal generating circuit 4220, which inverts the sense amplifier enable signal SAEN, is disposed adjacent to the first sub word-line driving circuit 4210 in the first region 4200. In the first region 4200, unused dummy transistors can exist. The first sense amplifier enable signal generating circuit 4220 can be implemented using the dummy transistors that exist in the first region 4200. In the same way, the second sense amplifier enable signal generating circuit 4220, which inverts the sense amplifier enable signal SAEN, can be disposed adjacent to the second sub word-line driving circuit 4310 in the second region 4300. In the second region 4300, unused dummy transistors can exist. And the second sense amplifier enable signal generating circuit 4320 can be implemented using the dummy transistors that exist in the second region 4300.

The memory core 4000 of FIG. 10 may decrease the size of the core conjunction area 4100 by disposing the sense amplifier enable signal generating circuits 4220 and 4320 in the sub word-line driving circuit area (SWD). Therefore, other logic circuits can be disposed in the core conjunction area.

The operation of the memory core of FIG. 10 is similar to the operation of the memory core of FIG. 3 and thus repeated description is omitted.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A memory core comprising:
a sub word-line driving circuit disposed in a first region, the first region being outside of a core conjunction region;
a sub word-line control signal generating circuit disposed in the first region and coupled to the sub word-line driving circuit; and
a word-line enable signal generating circuit disposed in the core conjunction region and coupled to the sub word-line driving circuit.

2. The memory core of claim 1, wherein the sub word-line control signal generating circuit is configured to invert a sub word-line driving signal to generate a first sub word-line control signal.

3. The memory core of claim 1, further comprising an inverter circuit disposed in the first region that is configured to invert an equalization control signal to generate an inverted equalization control signal.

4. The memory core of claim 1, further comprising an inverter circuit disposed in the first region that is configured to invert a sense amplifier enable signal to generate an inverted sense amplifier enable signal.

5. A semiconductor memory device comprising:
a sub word-line driving circuit disposed in a first region, the first region being outside of a core conjunction region;
a sub word-line control signal generating circuit disposed in the first region and coupled to the sub word-line driving circuit;
a word-line enable signal generating circuit disposed in the core conjunction region and coupled to the sub word-line driving circuit; and
an array unit disposed in a second region, that is separate from the first region and the core conjunction region, and configured to receive a first word-line driving signal from the sub word-line driving circuit.

6. A memory core comprising:
a sub word-line driving circuit disposed in a first region, the first region being outside of a core conjunction region;
an equalization control signal generating circuit disposed in the first region and coupled to the sub word-line driving circuit; and
a word-line enable signal generating circuit disposed in the core conjunction region and coupled to the sub word-line driving circuit.

7. The memory core of claim 6, wherein the equalization control signal generating circuit is configured to invert an equalization control signal to generate an inverted equalization control signal.

* * * * *